United States Patent
Chen et al.

(10) Patent No.: US 10,613,117 B2
(45) Date of Patent: Apr. 7, 2020

(54) PROBE CARD DEVICE AND RECTANGULAR PROBE THEREOF

(71) Applicant: CHUNGHWA PRECISION TEST TECH. CO., LTD., Taoyuan (TW)

(72) Inventors: Yen-Chen Chen, Taipei (TW); Wei-Jhih Su, Taichung (TW); Chih-Peng Hsieh, Taipei (TW)

(73) Assignee: CHUNGHWA PRECISION TEST TECH CO., LTD., Taoyuan (TW)

( * ) Notice: Subject to any disclaimer, the term of this patent is extended or adjusted under 35 U.S.C. 154(b) by 133 days.

(21) Appl. No.: 16/036,343

(22) Filed: Jul. 16, 2018

(65) Prior Publication Data

US 2019/0324057 A1  Oct. 24, 2019

(30) Foreign Application Priority Data

Apr. 18, 2018 (TW) .............................. 107113186 A

(51) Int. Cl.
| | |
|---|---|
| *G01R 1/07* | (2006.01) |
| *G01R 1/073* | (2006.01) |
| *G01R 1/067* | (2006.01) |
| *G01R 31/28* | (2006.01) |

(52) U.S. Cl.
CPC ..... *G01R 1/07342* (2013.01); *G01R 1/06716* (2013.01); *G01R 31/2831* (2013.01)

(58) Field of Classification Search
CPC ............ G01R 1/06716; G01R 31/2831; G01R 31/2884
See application file for complete search history.

(56) References Cited

U.S. PATENT DOCUMENTS

| | | | | |
|---|---|---|---|---|
| 2008/0164898 | A1* | 7/2008 | Bae ..................... | G01R 1/07385 324/762.06 |
| 2008/0258746 | A1* | 10/2008 | Tran ................... | G01R 1/06716 324/754.09 |
| 2009/0039907 | A1* | 2/2009 | Song .................. | G01R 1/06733 324/754.07 |

* cited by examiner

*Primary Examiner* — Jermele M Hollington
*Assistant Examiner* — Alvaro E Fortich
(74) *Attorney, Agent, or Firm* — Li & Cai Intellectual Property (USA) Office

(57) ABSTRACT

A rectangular probe of a probe card device includes an upper positioned segment, an upper contacting segment, a deformable segment, a lower positioned segment, and a lower contacting segment. The upper positioned segment includes an offset portion, a first positioned portion extending from the offset portion along a first direction, and a second positioned portion extending from a second direction being parallel to and opposite to the first direction. In a width direction perpendicular to the first direction, a width of the first positioned portion is 25%-95% of a width of the offset portion, and a width of the second positioned portion is 25%-95% of the width of the offset portion. The upper contacting segment extends from the first positioned portion along the first direction. The deformable segment, the lower positioned segment, and the lower contacting segment sequentially extend from the second positioned portion along the second direction.

10 Claims, 6 Drawing Sheets

PROBE CARD DEVICE AND RECTANGULAR PROBE THEREOF

CROSS-REFERENCE TO RELATED PATENT APPLICATION

This application claims the benefit of priority to Taiwan Patent Application No. 107113186, filed on Apr. 18, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe, and more particularly to a probe card device and a rectangular probe thereof.

BACKGROUND OF THE DISCLOSURE

In a testing process of semi-conductor wafer, a testing apparatus is electrically connected to an object to be tested by using a probe card device. The testing apparatus can obtain a testing result of the object to be tested by signal transmission and signal analysis. The conventional probe card device has a plurality of probes corresponding in position to electrical pads of the object, and the probes are used to simultaneously and respectively contact the electrical pads of the object.

Specifically, the probes of the conventional probe card device can be rectangular probes, which are made by using a micro-electromechanical systems (MEMS) technology to be formed in a shape based on design requirements. However, research and development around the conventional rectangular probe have been limited by conventional structures, which makes it difficult to provide a new technical effect.

SUMMARY OF THE DISCLOSURE

In response to the above-referenced technical inadequacies, the present disclosure provides a probe card device and a rectangular probe thereof to solve the issues associated with conventional rectangular probes.

In one aspect, the present disclosure provides a probe card device, which includes an upper die unit, a lower die, and a plurality of rectangular probes. The upper die unit includes a first die and a second die that is spaced apart from the first die. The lower die is arranged at one side of the second die away from the first die, and a distance between the lower die and the second die is larger than a distance between the first die and the second die. Each of the rectangular probes includes an upper positioned segment, an upper contacting segment, a deformable segment, a lower positioned segment, and a lower contacting segment. The upper positioned segment includes an offset portion, a first positioned portion extending from the offset portion along a first direction, and a second positioned portion extending from the offset portion along a second direction that is parallel to and opposite to the first direction. A central axis of the first positioned portion is parallel to the first direction and does not overlap with a central axis of the second positioned portion that is parallel to the second direction. In a width direction perpendicular to the first direction, a width of the first positioned portion is 25%-95% of a width of the offset portion, and a width of the second positioned portion is 25%-95% of the width of the offset portion. The upper contacting segment extends from the first positioned portion along the first direction. The deformable segment, the lower positioned segment, and the lower contacting segment sequentially extend from the second positioned portion along the second direction. The upper positioned segments of the rectangular probes are arranged in the upper die unit, the lower positioned segments of the rectangular probes are arranged in the lower die, and the deformable segments of the rectangular probes are arranged between the second die and the lower die. When the first die is moved relative to the second die along the width direction, the first die and the second die are respectively abutted against the first positioned portion and the second positioned portion of each of the rectangular probes in two opposite directions, and the offset portion of each of the rectangular probes is arranged between the first die and the second die.

In one aspect, the present disclosure provides a rectangular probe of a probe card device, which includes an upper positioned segment, an upper contacting segment, a deformable segment, a lower positioned segment, and a lower contacting segment. The upper positioned segment includes an offset portion, a first positioned portion extending from the offset portion along a first direction, and a second positioned portion extending from the offset portion along a second direction that is parallel to and opposite to the first direction. A central axis of the first positioned portion is parallel to the first direction and does not overlap with a central axis of the second positioned portion that is parallel to the second direction. In a width direction perpendicular to the first direction, a width of the first positioned portion is 25%-95% of a width of the offset portion, and a width of the second positioned portion is 25%-95% of the width of the offset portion. The upper contacting segment extends from the first positioned portion along the first direction. The deformable segment, the lower positioned segment, and the lower contacting segment sequentially extend from the second positioned portion along the second direction.

Therefore, for the probe card device and the rectangular probe of the present disclosure, the upper positioned segment of the rectangular probe includes the first positioned portion and the second positioned portion which are staggeredly connected to the offset portion, so that the rectangular probe is provided with a structure different from conventional rectangular probes, and the upper positioned segment of the rectangular probe can be provided with an individually positioned function. Specifically, the first die and the second die of the probe card device of the present disclosure are cooperated with the upper positioned segment of each of the rectangular probes, so that each of the rectangular probes can be effectively positioned in the upper die unit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
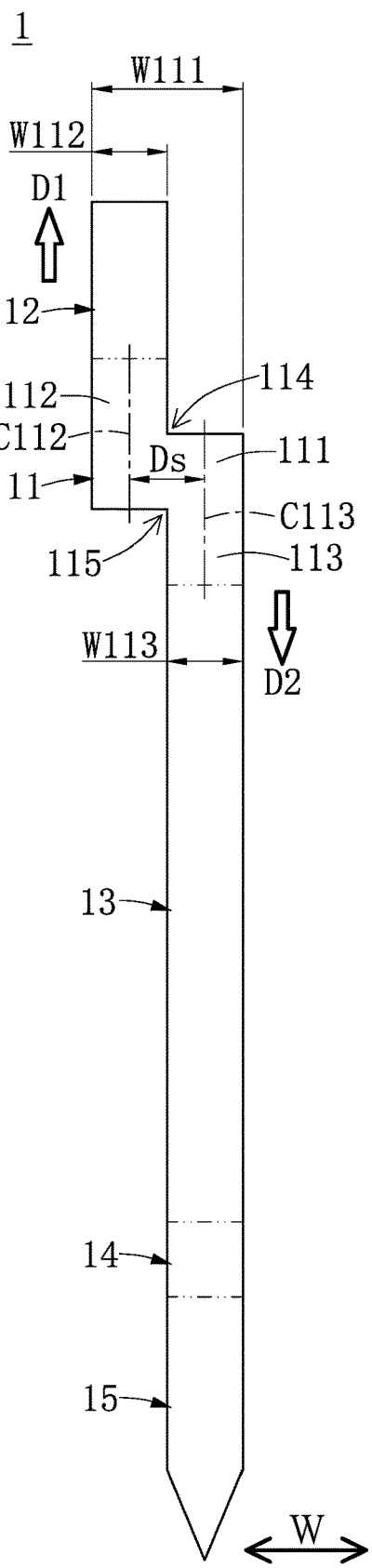
FIG. 1 is a schematic view of a rectangular probe according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
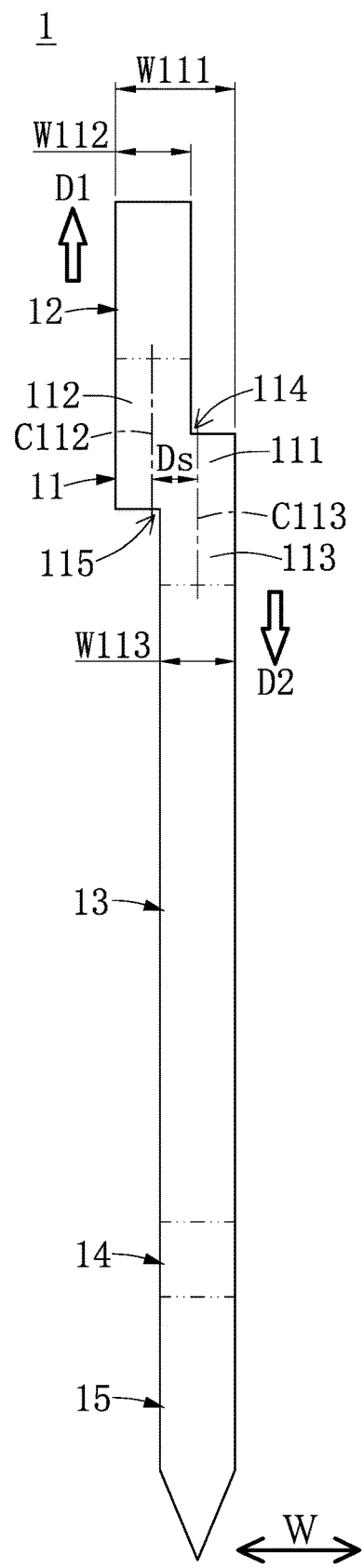
FIG. 2 is a schematic view of a rectangular probe according to the first embodiment of the present disclosure in another structure.

Referring to FIG. 1 and FIG. 2, a first embodiment of the present disclosure provides a rectangular probe 1 for being applied to a probe station or a probe card device. The rectangular probe 1 in the present embodiment is a flexible elongated structure having an electrically conductive property. The rectangular probe 1 of the present embodiment is preferably made by using the MEMS technology, and the present embodiment excludes any round probe produced by using a producing process different from the MEMS technology. In other words, since the producing process of the rectangular probe 1 is drastically different from that of any round probe, the round probe does not provide any motivation for the production of the rectangular probe 1.

The rectangular probe 1 in the present embodiment includes an upper positioned segment 11, an upper contacting segment 12 extending from an end of the first positioned portion 11 (e.g., the top end of the upper positioned segment 11 as shown in FIG. 1), a deformable segment 13, a lower positioned segment 14, and a lower contacting segment 15, the latter three of which sequentially extend from another end of the upper positioned segment 11 (e.g., the bottom end of the upper positioned segment 11 as shown in FIG. 1).

In the present embodiment, the upper positioned segment 11 includes an offset portion 111, a first positioned portion 112 extending from a top edge of the offset portion 111 along a first direction D1 (e.g., an upward direction as shown in FIG. 1), and a second positioned portion 113 extending from a bottom edge of the offset portion 111 along a second direction D2 (e.g., an downward direction as shown in FIG. 1) that is parallel to and opposite to the first direction D1.

In a width direction W perpendicular to the first direction D1, a width W112 of the first positioned portion 112 is 25%-95% of a width W111 of the offset portion 111, and a width W 113 of the second positioned portion 113 is 25%-95% of the width W111 of the offset portion 111. It should be noted that the width W112 of the first positioned portion 112 in the present embodiment is preferably equal to the width W113 of the second positioned portion 113, but the present disclosure is not limited thereto.

Moreover, a central axis C112 of the first positioned portion 112 is parallel to the first direction D1 and does not overlap with a central axis C113 of the second positioned portion 113 that is parallel to the second direction D2. In other words, the first positioned portion 112 and the second positioned portion 113 are in a staggered arrangement with respect to the offset portion 111. The central axis C112 of the first positioned portion 112 and the central axis C113 of the second positioned portion 113 have an offset distance Ds therebetween, and the offset distance Ds is within a range of 3 μm to 280 μm, but the present disclosure is not limited thereto.

Specifically, the rectangular probe 1 can be formed with different structures. For example, as shown in FIG. 1, a projecting region defined by orthogonally projecting the first positioned portion 112 along the second direction D2 is located outside of the second positioned portion 113 (i.e., a sum of 50% of the width W112 of the first positioned portion 112 and 50% of the width W113 of the second positioned portion 113 is smaller than or substantially equal to the offset distance Ds); or as shown in FIG. 2, a projecting region defined by orthogonally projecting the first positioned portion 112 along the second direction D2 overlaps with a part of the second positioned portion 113 (i.e., a sum of 50% of the width W112 of the first positioned portion 112 and 50% of the width W113 of the second positioned portion 113 is larger than the offset distance Ds).

In addition, the offset portion 111 and the first positioned portion 112 jointly define a first corner 114 that preferably has 90 degrees, and the offset portion 111 and the second positioned portion 113 jointly define a second corner 115 that preferably has 90 degrees. In other words, the first positioned portion 112 is perpendicularly connected to the offset portion 111, and the second positioned portion 113 is perpendicularly connected to the offset portion 111, but the present disclosure is not limited thereto.

The upper contacting segment 12 extends from the first positioned portion 112 along the first direction D1. A cross section of the upper contacting segment 12 perpendicular to the first direction D1 has an area that is smaller than or equal to an area of a cross section of the first positioned portion 112, in which the cross section of the first positioned portion 112 is perpendicular to the first direction D1. The upper contacting segment 12 of the present embodiment is preferably in a straight shape. That is to say, the upper contacting segment 12 of the present embodiment is preferably provided without any protruding structure, but the present disclosure is not limited thereto.

The deformable segment 13, the lower positioned segment 14, and the lower contacting segment 15 sequentially extend from the second positioned portion 113 along the second direction D2. In other words, the second positioned portion 113 (of the upper positioned segment 11), the deformable segment 13, the lower positioned segment 14, and the lower contacting segment 15 in the present embodiment are provided with an initial structure that is in a straight shape having the same width, but the present disclosure is not limited thereto.

Accordingly, the upper positioned segment 11 of the rectangular probe 1 includes the first positioned portion 112 and the second positioned portion 113 which are staggeredly connected to the offset portion 111, so that the rectangular probe 1 is provided with a structure different from conventional rectangular probes.

Second Embodiment

Figure 5:
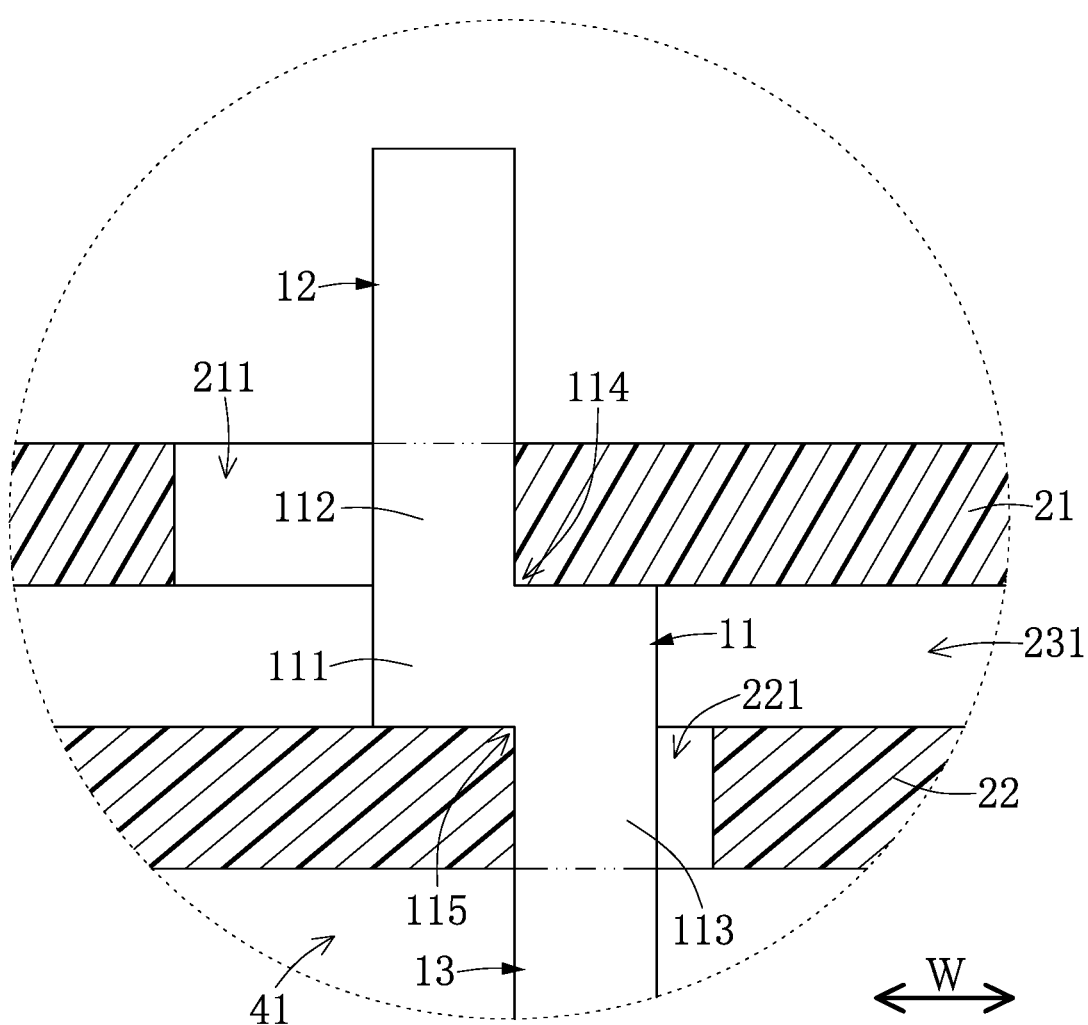
FIG. 5 is an enlarged view of a V region of FIG. 4 according to the second embodiment of the present disclosure.
Figure 6:
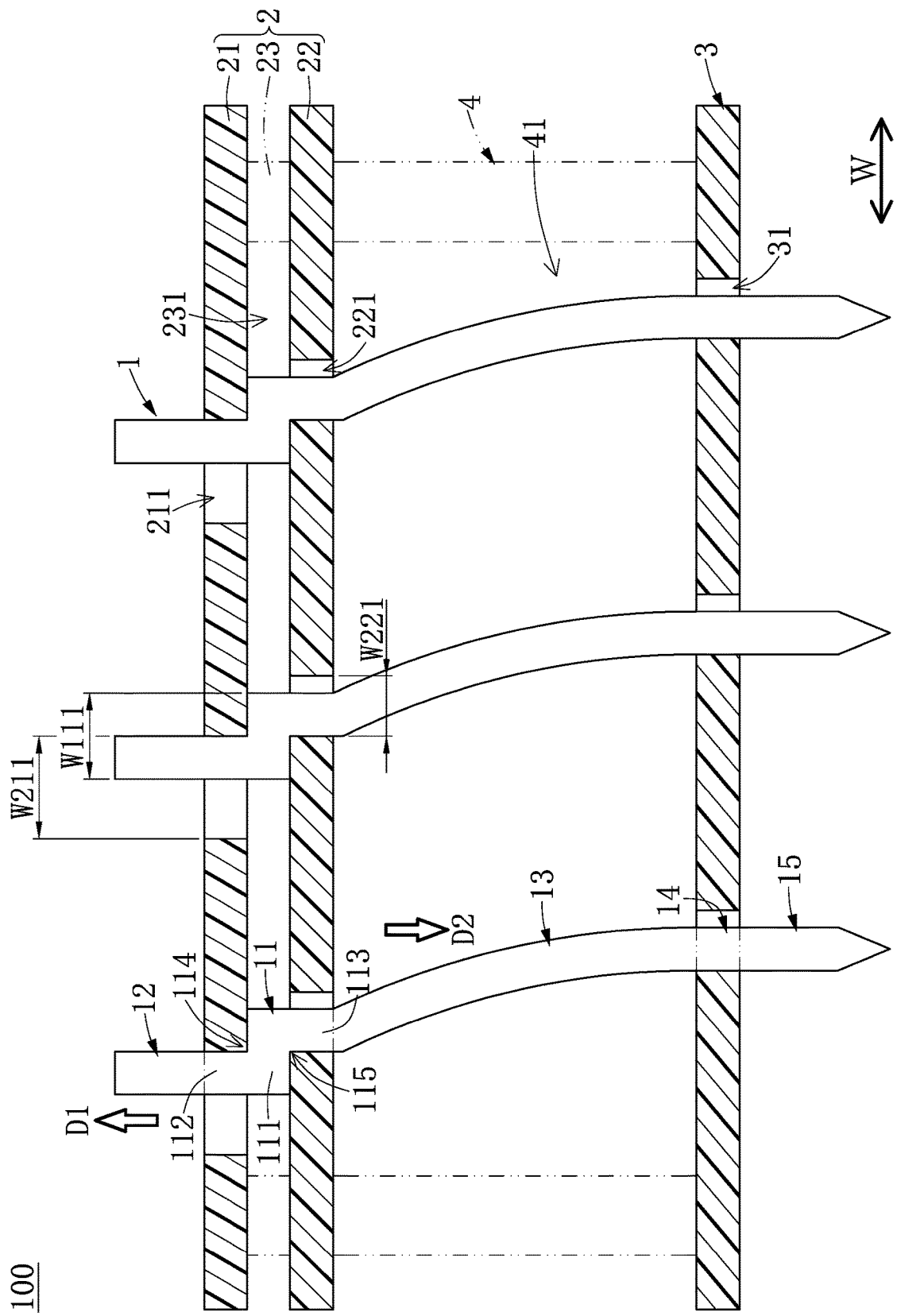
FIG. 6 is a cross-sectional view of the probe station that retains the rectangular probes thereof according to the second embodiment of the present disclosure.
Figure 7:
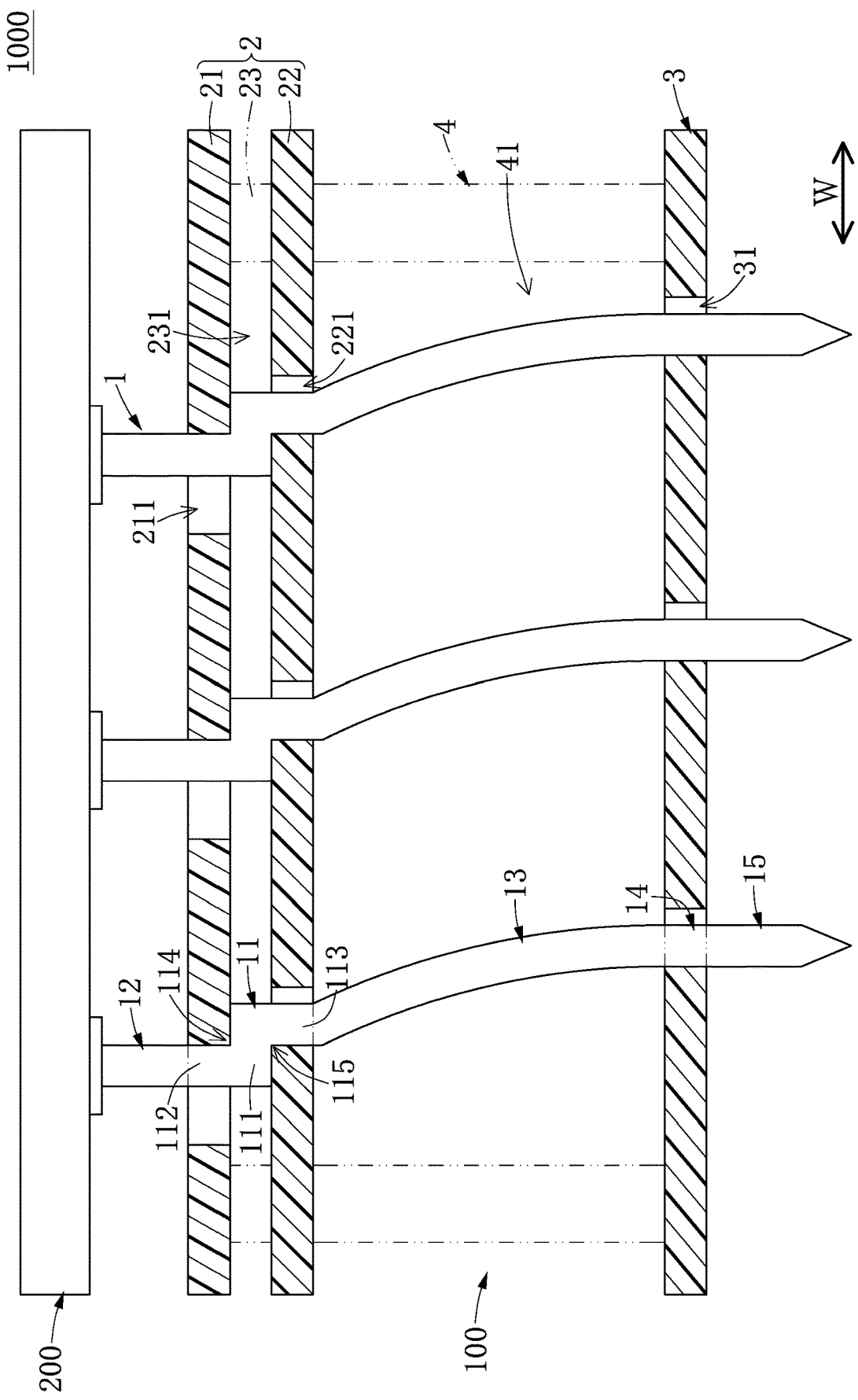
FIG. 7 is a cross-sectional view of the probe card device that retains the rectangular probes thereof according to the second embodiment of the present disclosure.

Referring to FIG. 3 to FIG. 7, a second embodiment of the present disclosure provides a probe card device 1000 including a probe station 100 and a space transformer 200 connected to one side of the probe station 100 (e.g., a top side of the probe station 100 as shown in FIG. 7). Another side of the probe station 100 (e.g., a bottom side of the probe station 100 as shown in FIG. 7) is configured to detect an object to be tested (not shown, such as a semi-conductor wafer). The probe station 100 in the present embodiment is cooperated with the space transformer 200, but the present disclosure is not limited thereto.

In order to more easily illustrate the present embodiment, the drawings only show a part of the probe card device 1000 to clearly show the structure and connection of each component of the probe card device 1000. The following description discloses the structure and connection of each component of the probe card device 1000.

Figure 3:
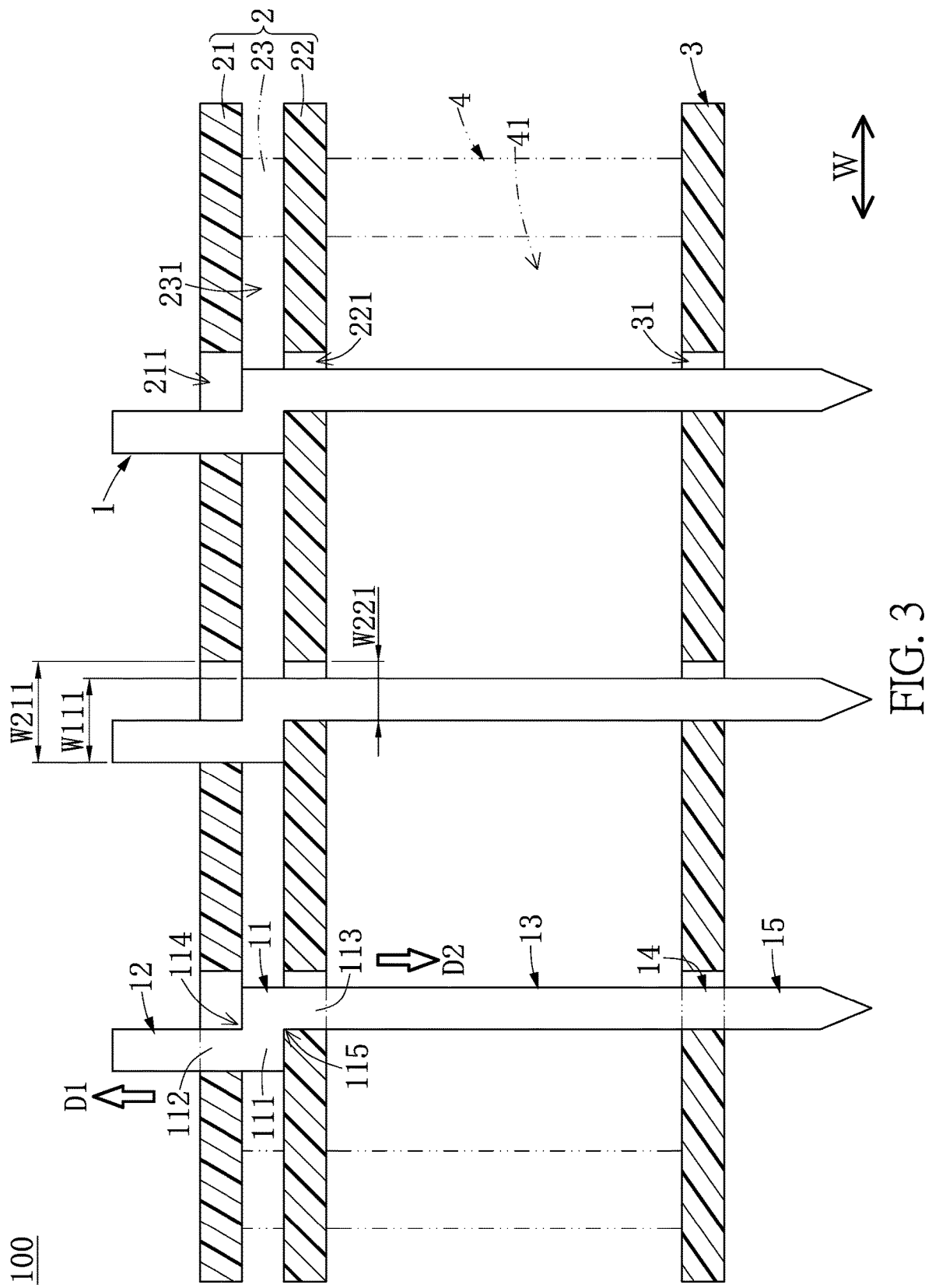
FIG. 3 is a cross-sectional view of a probe station of a probe card device that does not retain the rectangular probes thereof according to a second embodiment of the present disclosure.
Figure 4:
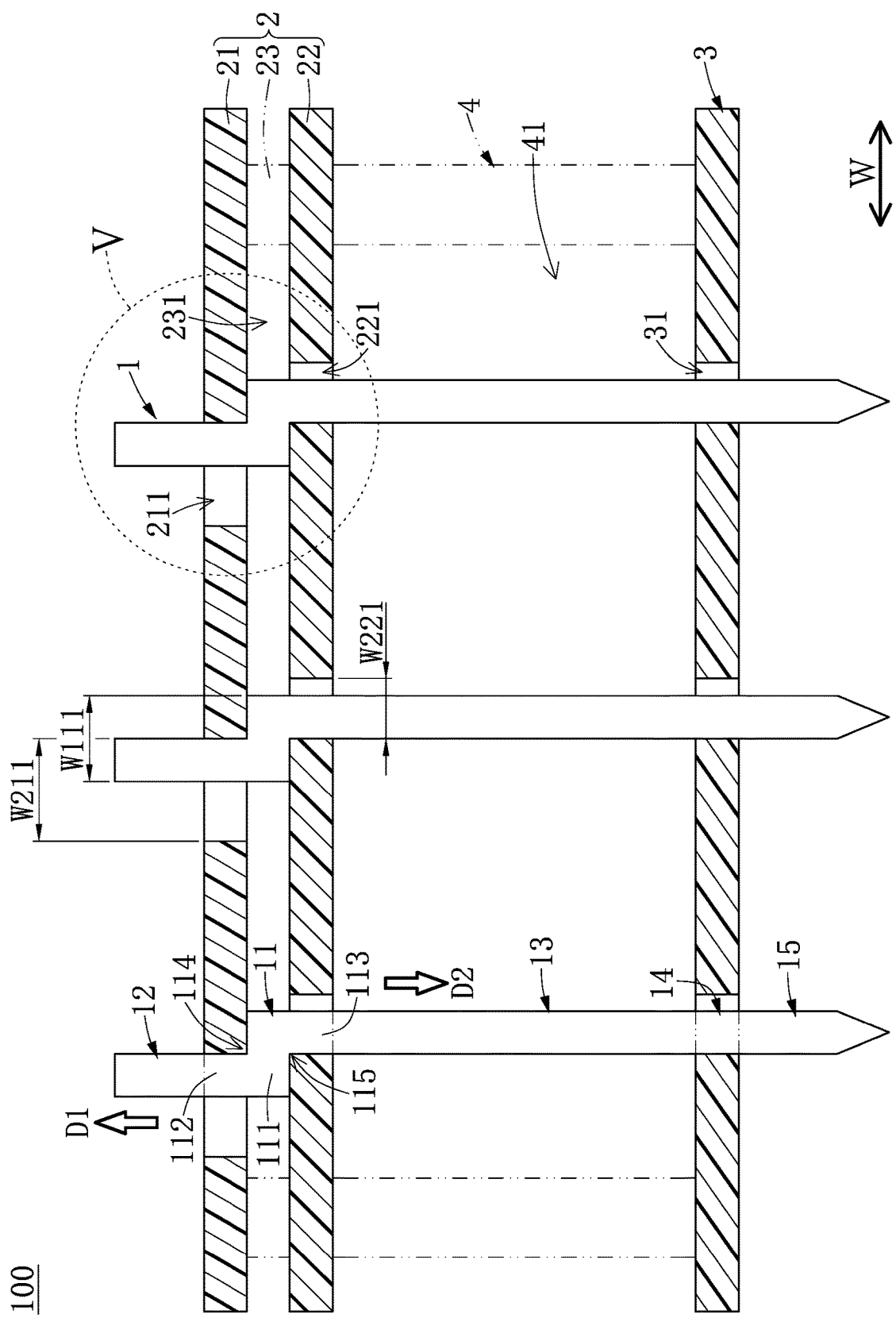
FIG. 4 is a cross-sectional view of the probe station that partially retains the rectangular probes thereof according to the second embodiment of the present disclosure.

As shown in FIG. 3 to FIG. 5, the probe station 100 includes an upper die unit 2, a lower die 3 substantially parallel to the upper die unit 2, a spacer 4 sandwiched between the upper die unit 2 and the lower die 3, and a plurality of rectangular probes 1 inserted into the upper die unit 2 and the lower die 3. Each of the rectangular probes 1 in the present embodiment is identical to the rectangular probe 1 disclosed in the first embodiment as shown in FIG. 1 or FIG. 2, so that the present embodiment does not disclose the structure of the rectangular probe 1 again.

Since the rectangular probes 1 of the probe station 100 in the present embodiment are of the same structure, the drawings only show a part of the probe station 100 or the probe card device 1000 (i.e., three rectangular probes 1 and the corresponding structure) for the sake of brevity. However, in other embodiments of the present disclosure, the rectangular probes 1 of the probe card device 1000 can be formed with different structures.

As shown in FIG. 3 to FIG. 5, the upper die unit 2 in the present embodiment includes a first die 21, a second die 22 spaced apart from the first die 21, and a supporting plate 23 sandwiched between the first die 21 and the second die 22. The first die 21 has a plurality of first thru-holes 211, and the second die 22 has a plurality of second thru-holes 221. The first thru-holes 211 of the first die 21 respectively correspond in position to the second thru-holes 221 of the second die 22, and each of the first thru-holes 211 is preferably larger than or equal to the corresponding second thru-hole 221.

Moreover, the first thru-hole 211 is larger than or equal to the offset portion 111 of the rectangular probe 1, and the second thru-hole 221 is smaller than the offset portion 111, so that the upper positioned segment 11 of the rectangular probe 1 can pass through the first thru-hole 211, but cannot pass through the second thru-hole 221. In other words, the width W111 of the offset portion 111 of the rectangular probe 1 is smaller than or equal to a width W211 of the first thru-hole 211, and is larger than a width W221 of the second thru-hole 221. Each of the widths W111, W211, W221 in the present embodiment is perpendicular to the first direction D1.

A thickness of the supporting plate 23 is substantially equal to a thickness of the offset portion 111 of the rectangular probe 1, and the supporting plate 23 has an accommodating space 231 formed in an inner side thereof. Two opposite surfaces of the supporting plate 23 are respectively abutted against the first die 21 and the second die 22 for maintaining the first die 21 and the second die 22 to be spaced apart from each other. The first thru-holes 211 of the first die 21 and the second thru-holes 221 of the second die 22 are in spatial communication with the accommodating space 231 of the supporting plate 23.

In addition, the first die 21 and the second die 22 in the present embodiment are spaced apart from each other by the supporting plate 23, but the present disclosure is not limited thereto. For example, in other embodiments of the present disclosure, the first die 22 can be formed with a thicker portion to abut against the second die 22, thereby omitting the supporting plate 23; or the supporting plate 23 of the upper die unit 2 can be replaced by a third die.

As shown in FIG. 3 to FIG. 5, the lower die 3 has a plurality of lower thru-holes 31, and each of the lower thru-holes 31 is preferably smaller than or equal to each of the second thru-holes 221. The lower die 3 is arranged at one side of the second die 22 away from the first die 21 (e.g., a lower side of the second die 22 as shown in FIG. 3), and a distance between the lower die 3 and the second die 22 is larger than a distance between the first die 21 and the second die 22.

Moreover, a thickness of the spacer 4 is approximately equal to a length of the deformable segment 13 of the rectangular probe 1, and the spacer 4 has an accommodating hole 41 formed in an inner side thereof. The spacer 4 is sandwiched between the second die 22 and the lower die 3 for maintaining a distance between the second die 22 and the lower die 3. The second thru-holes 221 of the second die 22 and the lower thru-holes 31 of the lower die 3 are in spatial communication with the accommodating hole 41 of the spacer 4.

In addition, the second die 22 and the lower die 3 in the present embodiment are spaced apart from each other by the spacer 4, but the present disclosure is not limited thereto. For example, in other embodiments of the present disclosure, the second die 22 and the lower die 3 can be spaced apart from each other in other manners or structures.

As shown in FIG. 3, each of the rectangular probes 1 sequentially passes through the upper die unit 2, the spacer 4, and the lower die 3. The upper positioned segments 11 of the rectangular probes 1 are arranged in the upper die unit 2. The deformable segments 13 of the rectangular probes 1 are arranged between the second die 22 and the lower die 3 (e.g., the deformable segments 13 of the rectangular probes 1 are arranged in the accommodating hole 41 and are spaced apart from each other). The lower positioned segments 14 of the rectangular probes 1 are respectively arranged in the lower thru-holes 31 of the lower die 3. The upper contacting segments 12 and the lower contacting segments 15 of the rectangular probes 1 are respectively arranged at two opposite sides of the upper die unit 2 and the lower die 3 away from each other (e.g., an upper side of the upper die unit 2 and a lower side of the lower die 3 as shown in FIG. 3).

Specifically, the first positioned portion 112 of the upper positioned segments 11 are respectively arranged in the first thru-holes 211 of the first die 21, the second positioned portion 113 of the upper positioned segments 11 are respectively arranged in the second thru-holes 221 of the second die 22, and the offset portions 111 of the upper positioned segments 11 are arranged in the accommodating space 231 and are spaced apart from each other.

As shown in FIG. 4 and FIG. 5, when the first die 21 is moved relative to the second die 22 along the width direction W, the first die 21 and the second die 22 in the present embodiment are respectively abutted against the first positioned portion 112 and the second positioned portion 113 of each of the rectangular probes 1 in two opposite directions, and the offset portion 111 of each of the rectangular probes 1 is arranged between the first die 21 and the second die 22.

Specifically, when the first die 21 is moved relative to the second die 22 along the width direction W, the first die 21 in the present embodiment is abutted against the first corner 114 of each of the rectangular probes 1, and the second die 22 is abutted against the second corner 115 of each of the rectangular probes 1. In other words, the offset portion 111 of each of the rectangular probes 1 is sandwiched between the first die 21 and the second die 22. However, in other embodiments of the present disclosure, the offset portion 111 of each of the rectangular probes 1 can be disposed on the second die 22, and is not sandwiched between the first die 21 and the second die 22.

Accordingly, the first die 21 and the second die 22 of the probe card device 1000 are cooperated with the upper positioned segment 11 of each of the rectangular probes 1, so that each of the rectangular probes 1 can be effectively positioned in the upper die unit 2.

As shown in FIG. 6, when the upper die unit 2 is moved relative to the lower die 3 (e.g., one of the upper die unit 2 and the lower die 3 is moved) along an oblique direction perpendicular to the second direction D2, the upper die unit 2 and the lower die 3 respectively press the upper positioned segment 11 and the lower positioned segment 14 of each of the rectangular probes 1, so that the deformable segment 13 of each of the rectangular probes 1 is compressed to be in a curved and deformed shape. In other words, the rectangular probe 1 of the present embodiment excludes a probe (e.g., a cobra probe) that is integrally formed with a curved segment. In addition, the oblique direction in the present embodiment and the width direction W are preferably arranged on the same plane and have an angle smaller than 90 degrees, but the present disclosure is not limited thereto.

As shown in FIG. 7, the space transformer 200 is fixed on free ends of the upper contacting segments 12 of the rectangular probes 1, and free ends of the lower contacting segments 15 of the rectangular probes 1 are configured to elastically and detachably abut against an object to be tested (not shown, such as a semi-conductor wafer). In the present embodiment, the upper die unit 2 and the upper positioned segment 11 of each of the rectangular probes 1 are arranged adjacent to the space transformer 200. In other words, the present embodiment excludes the upper die unit 2 (or the upper positioned segment 11 of each of the rectangular probes 1) that is arranged adjacent to the object to be tested.

In conclusion, for the probe card device 1000 and the rectangular probe 1 of the present disclosure, the upper positioned segment 11 of the rectangular probe 1 includes the first positioned portion 112 and the second positioned portion 113 which are staggeredly connected to the offset portion 111, so that the rectangular probe 1 is provided with a structure different from conventional rectangular probes, and that the upper positioned segment 11 of the rectangular probe 1 can be individually positioned. Specifically, the first die 21 and the second die 22 of the probe card device 1000 are cooperated with the upper positioned segment 11 of each of the rectangular probes 1, so that each of the rectangular probes 1 can be effectively positioned in the upper die unit 2.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device, comprising:
   an upper die unit including a first die and a second die that is spaced apart from the first die;
   a lower die arranged at one side of the second die away from the first die, wherein a distance between the lower die and the second die is larger than a distance between the first die and the second die; and
   a plurality of rectangular probes each including:
      an upper positioned segment including an offset portion, a first positioned portion extending from the offset portion along a first direction, and a second positioned portion extending from the offset portion along a second direction that is parallel to and opposite to the first direction, wherein a central axis of the first positioned portion is parallel to the first direction and does not overlap with a central axis of the second positioned portion that is parallel to the second direction, and wherein in a width direction perpendicular to the first direction, a width of the first positioned portion is 25%-95% of a width of the offset portion, and a width of the second positioned portion is 25%-95% of the width of the offset portion;

an upper contacting segment extending from the first positioned portion along the first direction; and a deformable segment, a lower positioned segment, and a lower contacting segment that sequentially extend from the second positioned portion along the second direction, wherein the upper positioned segments of the rectangular probes are arranged in the upper die unit, the lower positioned segments of the rectangular probes are arranged in the lower die, and the deformable segments of the rectangular probes are arranged between the second die and the lower die, and wherein when the first die is moved relative to the second die along the width direction, the first die and the second die are respectively abutted against the first positioned portion and the second positioned portion of each of the rectangular probes in two opposite directions, and the offset portion of each of the rectangular probes is arranged between the first die and the second die.

2. The probe card device according to claim 1, wherein in each of the rectangular probes, the central axis of the first positioned portion and the central axis of the second positioned portion have an offset distance therebetween, and the offset distance is within a range of 3 μm to 280 μm.

3. The probe card device according to claim 1, wherein in each of the rectangular probes, the offset portion and the first positioned portion jointly define a first corner, and the offset portion and the second positioned portion jointly define a second corner, and wherein when the first die is moved relative to the second die along the width direction, the first die is abutted against the first corner of each of the rectangular probes, and the second die is abutted against the second corner of each of the rectangular probes.

4. The probe card device according to claim 1, wherein in each of the rectangular probes, the upper contacting segment is in a straight shape, and a cross section of the upper contacting segment perpendicular to the first direction has an area that is smaller than or equal to an area of a cross section of the first positioned portion.

5. The probe card device according to claim 1, wherein when the upper die unit is moved relative to the lower die along an oblique direction perpendicular to the second direction, the upper die unit and the lower die respectively press the upper positioned segment and the lower positioned segment of each of the rectangular probes, so that the deformable segment of each of the rectangular probes is compressed to be in a curved and deformed shape.

6. The probe card device according to claim 1, further comprising a space transformer fixed on free ends of the upper contacting segments of the rectangular probes, wherein free ends of the lower contacting segments of the rectangular probes are configured to elastically and detachably abut against an object to be tested.

7. The probe card device according to claim 1, wherein the upper die unit includes a supporting plate sandwiched between the first die and the second die, the supporting plate has an accommodating space formed in an inner side thereof, and the offset portions of the rectangular probes are arranged in the accommodating space and are spaced apart from each other, and wherein the probe card device includes a spacer sandwiched between the second die and the lower die, the spacer has an accommodating hole formed in an inner side thereof, and the deformable segments of the rectangular probes are arranged in the accommodating hole and are spaced apart from each other.

8. A rectangular probe of a probe card device, comprising:

an upper positioned segment including an offset portion, a first positioned portion extending from the offset portion along a first direction, and a second positioned portion extending from the offset portion along a second direction that is parallel to and opposite to the first direction, wherein a central axis of the first positioned portion is parallel to the first direction and does not overlap with a central axis of the second positioned portion that is parallel to the second direction, and wherein in a width direction perpendicular to the first direction, a width of the first positioned portion is 25%-95% of a width of the offset portion, and a width of the second positioned portion is 25%-95% of the width of the offset portion;

an upper contacting segment extending from the first positioned portion along the first direction; and a deformable segment, a lower positioned segment, and a lower contacting segment that sequentially extend from the second positioned portion along the second direction.

9. The rectangular probe according to claim 8, wherein the central axis of the first positioned portion and the central axis of the second positioned portion have an offset distance therebetween, and the offset distance is within a range of 3 μm to 280 μm.

10. The rectangular probe according to claim 8, wherein a projecting region defined by orthogonally projecting the first positioned portion along the second direction overlaps with a part of the second positioned portion.

* * * * *